United States Patent [19]

Levi

[11] Patent Number: 5,434,816
[45] Date of Patent: Jul. 18, 1995

[54] TWO-TRANSISTOR DYNAMIC RANDOM-ACCESS MEMORY CELL HAVING A COMMON READ/WRITE TERMINAL

[75] Inventor: Mark W. Levi, Utica, N.Y.

[73] Assignee: The United States of America as represented by the Secretary of the Air Force, Washington, D.C.

[21] Appl. No.: 264,828

[22] Filed: Jun. 23, 1994

[51] Int. Cl.6 ............................................. G11C 7/00
[52] U.S. Cl. ................... 365/189.01; 365/149; 365/174; 365/189.03
[58] Field of Search .............. 365/51, 189.01, 149, 365/174, 189.03

[56] References Cited

U.S. PATENT DOCUMENTS

| | | | |
|---|---|---|---|
| 3,449,727 | 6/1969 | Pricer | 365/174 |
| 3,513,365 | 5/1970 | Levi | 317/235 |
| 3,634,825 | 1/1972 | Levi | 340/166 FE |
| 3,997,881 | 12/1976 | Hoffmann | 365/174 |
| 4,488,264 | 12/1984 | Dshkhunian et al. | 365/189 |
| 4,599,708 | 7/1986 | Schuster | 365/189 |
| 4,771,323 | 9/1988 | Sasaki | 357/23.6 |
| 4,926,378 | 5/1990 | Uchida et al. | 365/179 |

Primary Examiner—Joseph A. Popek
Assistant Examiner—Son Dinh
Attorney, Agent, or Firm—William G. Auton; Jacob N. Erlich

[57] ABSTRACT

A two transistor dynamic random access memory can be treated as a pair of voltage controlled elements which are reversibly controlled in a three step process. In the first step, a capacitance is charged on the controlling terminal of memory transistor. The second step entails isolating the charge on the capacitance of the controlling terminal. The third step entails providing a reversibly controlled voltage on the controlling terminal to further control the two memory transistors without altering the charge of the capacitance. This allows a non-destructive reading of the output of the stored information signal.

2 Claims, 2 Drawing Sheets

TWO-TRANSISTOR DYNAMIC RANDOM-ACCESS MEMORY CELL HAVING A COMMON READ/WRITE TERMINAL

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to semiconductors and more specifically the invention pertains to circuits for semiconductor dynamic random access memory (DRAM) cells which are an improvement over previously known two transistor cells by requiring fewer access lines and permitting more compact layout of the cells.

A dynamic memory is a type of semiconductor memory in which the presence or absence of an electrical capacitive charge represents the two states of a binary storage element. Field effect transistors are used as memory storage elements, where each bit is stored as a charge on a single transistor. This results in a high density storage with one transistor per bit. In such systems, the charge leaks and, therefore a typical dynamic memory must be refreshed by rewriting its entire contents.

The task of providing a dynamic semiconductor memory is alleviated, to some extent, by the systems disclosed in the following U.S. Patents, the disclosures of which are incorporated herein by reference:

U.S. Pat. No. 4,488,264 issued to Dshkhunian et al;
U.S. Pat. No. 4,599,708 issued to Schuster;
U.S. Pat. No. 4,771,323 issued to Sasaki;
U.S. Pat. No. 4,926,378 issued to Uchida et al;
U.S. Pat. No. 3,513,365 issued to Levi; and
U.S. Pat. No. 3,634,825 issued to Levi.

Dshkunian et al disclose a transistor storage wherein the multidigit data buses are connected to write circuits and read amplifiers of a first readout direction and second readout direction. The write circuits are connected to the read bus and the read amplifiers are connected to the read bus.

Schuster discloses machine data storage with simultaneous write and read. A comparison identity is made of simultaneously timed write and read addresses. In response thereto, the normal read operation is inhibited while at the same time the write data signals are supplied as read data signals.

Sasaki discloses a semiconductor memory device wherein the potential to the word line is varied such that a first potential is applied for writing data, a second potential is applied for maintaining stored data, and a third potential is applied to read the stored data out.

Uchida et al disclose a bipolar static RAM having two wiring lines for each word line. A pair of layers form a pair of wiring lines corresponding together to a word line.

In view of the foregoing discussion, it is apparent that the development of dynamic random access memory elements represents an ongoing technological need. The present invention is intended to help satisfy that need.

SUMMARY OF THE INVENTION

The present invention relates generally to semiconductors and more specifically the invention pertains to circuits for semiconductor dynamic random access memory (DRAM) cells which are an improvement over previously known two transistor cells by requiring fewer access lines and permitting more compact layout of the cells. Specifically, this is an improvement of my previous patents 3,513,365 and 3,634,825 which describe two transistor DRAM's which can be used as crosspoints, as non-destructive readout DRAM or, by using two cells per bit, as associative memory. The design and operation of those cells required two or three connections in the word direction of an array and one connection in the data direction for each cell. This invention provides a tradeoff between the number of word direction connections and restrictions on the DC voltage on the read line.

It is an object of the invention to provide a dynamic random access memory circuit controlled by a reversibly controlled voltage signal.

It is another object of the present invention to provide a method for controlling a voltage controlled element.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

Figure 1:
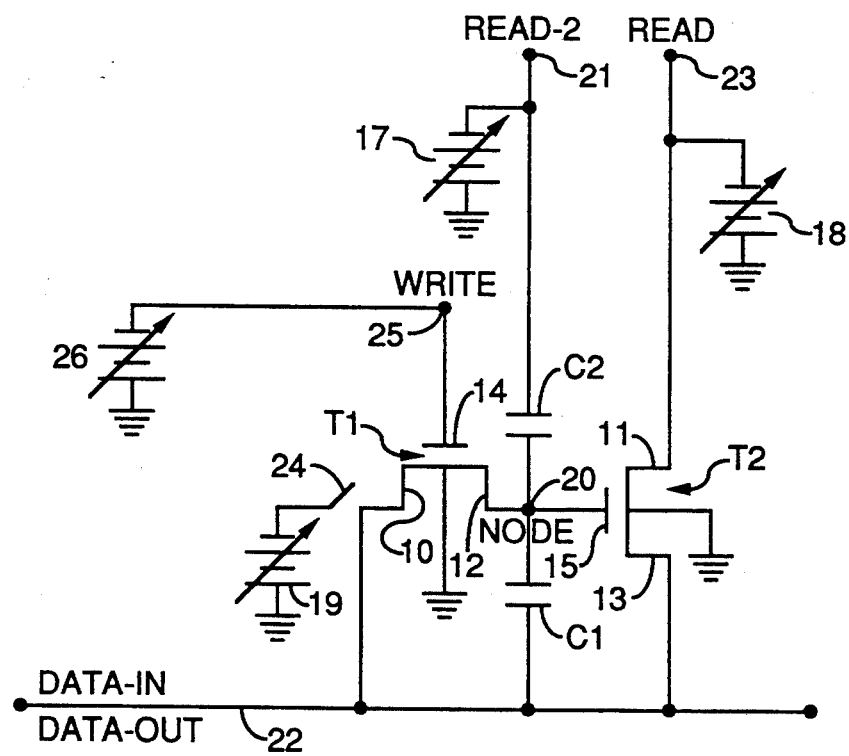
FIG. 1 is an electrical schematic of one embodiment of my prior patent 3,513,365.

Referring first to the prior art (my prior patent 3,513,365), illustrated in FIG. 1, there is shown the electrical schematic of an integrated semiconductor dynamic random access memory circuit having a first transistor T1 controlled by a variable voltage source 26. By turning on transistor T1, the voltage on the data-in/out line 22 will appear on the node 20, and when transistor T1 is then turned off, that voltage is stored on the node. The voltage on node 20 may have different values representing logical 1's and 0's, but none may exceed the threshold of Transistor T2. Thereafter, with a voltage on read terminal 23, varying read-2 voltage 17 causes the voltage on the node 20 to exceed the threshold of transistor T2 and a portion of the voltage on terminal 23 to appear on the data-in/out line only if a sufficient voltage was already stored on the node 20. Such operation results in a non-inverting output, but the magnitude of the high output is not as great as the high voltage stored on the node.

Figure 2:
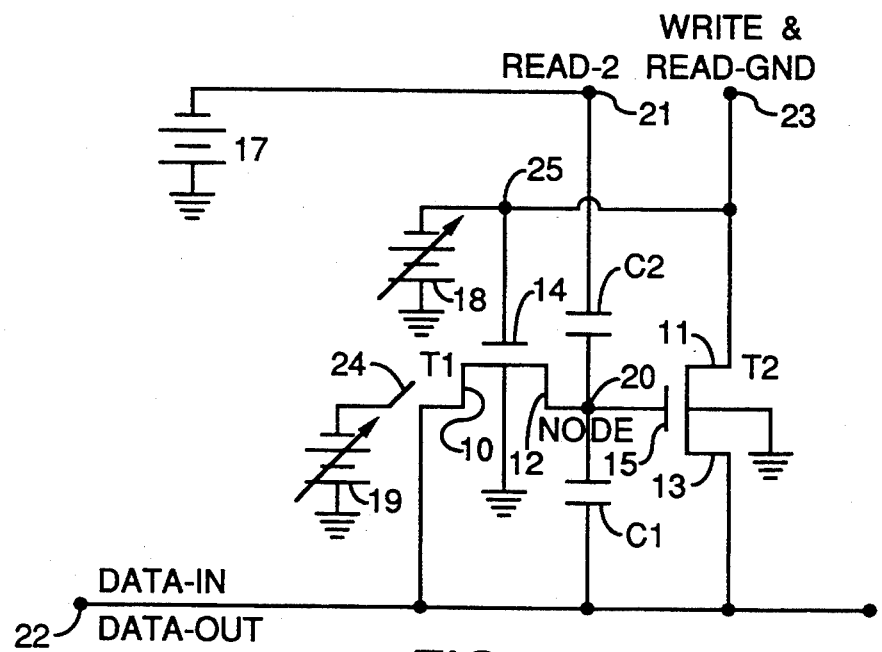
FIG. 2, is an electrical schematic of a preferred embodiment of the present invention.

FIG. 2 shows an improvement over my prior art patent in that the write terminal 25 is connected to the read terminal 23, whereby the terminal 23 becomes a write/read-ground terminal and eliminates the requirement for a separate external connecting line for controlling transistor T1 for writing.

Figure 3:
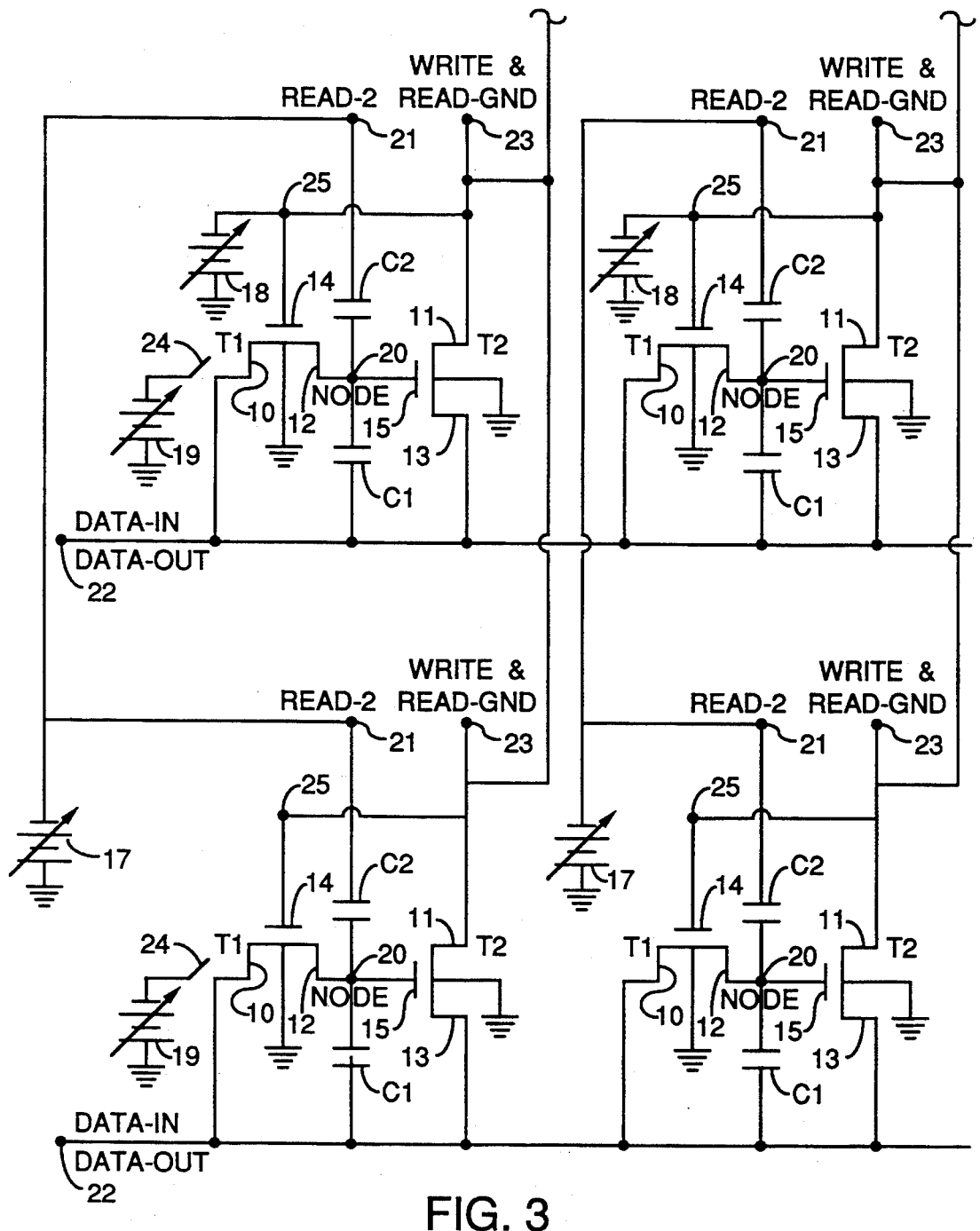
FIG. 3 shows cells of FIG. 2 arranged in an array of rows and columns.

FIG. 3 shows 4 cells, identical to those shown in FIG. 2, and arranged in a rectangular array. It will be understood, that such an array will contain many such cells, and FIG. 3 simply illustrates how the cells are interconnected in columns and rows.

Operation of the invention as shown in FIGS. 2 and 3 is similar to that of U.S. Pat. No. 3,513,365 (as described in FIG. 1) for reading information from the cell in an array of cells. The difference arises only in the voltages applied to the write/read-gnd line 23 and the data in/out line 22 during the writing and reading processes. In order to write information into a cell, the voltage on the write/read-ground line 23 is controlled so as to turn on transistor T1 while a data voltage is maintained on the data-in/out terminal 22, and then the write/read-ground line voltage is controlled to turn off transistor T1 and to be substantially at the lower of the voltages representing an input logical 1 or 0. To read, the data line 22 is precharged, and upon reversibly driving the node 20 through capacitor C2 (as taught in 3,513,365) the data in/out line 22 is discharged to the voltage of the write/read-gnd line 23 only if a high level had been stored on the node 20. This method of readout produces an inversion of the stored information. That is, the pre-charged voltage (a high level) will be discerned on the data line 22 if a low level is stored in the cell, and the level on the write/read-ground line will be discerned if a high level is stored in the cell. Specifically, if the high and low voltages read out of cells substantially match the data voltages used to write cells, the read out, stored temporarily on the data-in/out line, can be written back into the cell, read out again and rewritten once more to refresh the stored information. If information is retained as to how many times each column has been rewritten, the second rewrite is not needed since the phase of the information will be knowable. As in patent 3,513,365 both the high and low stored levels in the cells must be below the threshold voltage of T2 and the added voltage on the node from changing the read-2 voltage must be insufficient to cause the threshold of T2 to be exceeded and discharge of the data line when a low level had been stored on the node.

What is claimed is:

1. A dynamic random access memory circuit for storing an information signal, and which comprises:
    a data-in/out terminal which receives an information signal, wherein the information signal on the data-in-/out terminal results from reading a stored logical 1 represented by a positive voltage, and wherein the information signal on the data-in/out terminal results from reading a stored logical 0 represented by a positive voltage;
    a write/lead/gnd terminal and at least one read-2 terminal;
    a first and a second memory transistor, each memory transistor having a gate electrode and first and second source/drain electrodes,
    the gate electrode of the first transistor being connected to the first source/drain electrode of the second transistor and to said write/read-gnd terminal,
    the second source/drain terminal of the second transistor being connected to said data-in terminal,
    the first source/drain electrode of said first transistor being connected to said data-in terminal,
    the second source/drain electrode of said first transistor being connected to the gate electrode of said second transistor forming an electrical node, said node having capacitances to said at least one read-2 terminal;
    a first-voltage driving source and at least one second-voltage driving sources which respectively output first and at least one second-voltage driving signals;
    means for adjusting said first voltage driving source so as to cause said first transistor to become conductive between its source and drain electrodes thereby causing any information voltage representing information on said data-in/out terminal to be placed on said node and said capacitances to be charged to said information signal voltage on said data-in terminal, the voltage on said node being of such value that said second transistor is non-conductive, the voltage of the first driving source then being changed to make the first transistor non-conductive, and the first source/drain of the second transistor to function as a source, whereby said voltage on said node is maintained at the level of said voltage on said data-in terminal, and the information voltage on said data-in terminal is stored upon said node, and said second transistor is non-conductive;
    means for subsequently providing a voltage and charge upon said data-in/out terminal, and means for thereafter first-changing said at least first second-voltage driving sources such as to induce an additional voltage upon said node via said capacitance(s) such that said second transistor conducts only if said stored information voltage is one of the voltages which may be stored upon said node, and will not become conductive if said stored information voltage is another of the voltages which may be so stored, whereby the information of the information voltage on said node can be discerned on the said data-in/out terminal;
    means for discerning said information; and
    means for subsequently changing said second driving voltage(s) such that the voltage upon said node returns to its value prior to said first-changing and such that said second transistor becomes or remains non-conductive.

2. A plurality of dynamic random-access memory cells each constructed in accordance with claim 1, said cells being arranged as a topologically rectangular array with a number N of columns, and a number M of rows, and the first read-2 terminal of each of the cells in a column being connected together and driven by a first second-voltage driving source for said column, and the write/read-ground terminals of each cell in said column being connected together and driven by a first voltage driving source for said column, and wherein the cells of each row in said array have their data-in/out terminals in common to form a data input/output terminal for said row.

* * * * *